United States Patent
Chung et al.

(10) Patent No.: US 10,080,299 B2
(45) Date of Patent: Sep. 18, 2018

(54) MANUFACTURING METHOD OF DOUBLE SIDED PRINTED CIRCUIT BOARD

(71) Applicant: INKTEC CO., LTD., Gyeonggi-do (KR)

(72) Inventors: Kwang-Choon Chung, Gyeonggi-do (KR); Young-Koo Han, Gyeonggi-do (KR); Myung-Bong Yoo, Gyeonggi-do (KR); Kwang-Baek Yoon, Gyeonggi-do (KR); Bong-Ki Jung, Gyeonggi-do (KR)

(73) Assignee: INKTEC CO., LTD., Ansan-si, Gyeonggi-Do (TW)

( * ) Notice: Subject to any disclaimer, the term of this patent is extended or adjusted under 35 U.S.C. 154(b) by 337 days.

(21) Appl. No.: 14/370,644

(22) PCT Filed: Jan. 4, 2013

(86) PCT No.: PCT/KR2013/000064
§ 371 (c)(1),
(2) Date: Jul. 3, 2014

(87) PCT Pub. No.: WO2013/103265
PCT Pub. Date: Jul. 11, 2013

(65) Prior Publication Data
US 2015/0000125 A1    Jan. 1, 2015

(30) Foreign Application Priority Data

Jan. 4, 2012  (KR) .................. 10-2012-0001205
Jan. 4, 2013  (KR) .................. 10-2013-0001252

(51) Int. Cl.
*H05K 3/40*   (2006.01)
*H05K 3/12*   (2006.01)
*H05K 3/24*   (2006.01)

(52) U.S. Cl.
CPC ............. *H05K 3/4069* (2013.01); *H05K 3/12* (2013.01); *H05K 3/246* (2013.01);
(Continued)

(58) Field of Classification Search
CPC ........ H05K 3/4069; H05K 3/246; H05K 3/12; H05K 2201/0154; H05K 2203/1383; Y10T 29/49155
See application file for complete search history.

(56) References Cited

U.S. PATENT DOCUMENTS 4,290,195 A *  9/1981  Rippere ............... H05K 3/3484
                                          228/248.5
6,303,881 B1 * 10/2001  Parker, Jr. ........... H05K 3/4069
                                          174/256
(Continued)

FOREIGN PATENT DOCUMENTS

JP    07-054872    2/1995
JP    H0799376     4/1995
(Continued)

OTHER PUBLICATIONS

International Search Report for corresponding International Application No. PCT/KR2013-000064.

*Primary Examiner* — Peter DungBa Vo
*Assistant Examiner* — Jeffrey Carley
(74) *Attorney, Agent, or Firm* — Hauptman Ham, LLP

(57) ABSTRACT

Provided is a manufacturing method of a double-sided printed circuit board. In the method, a first conductive circuit pattern configuring a circuit is formed on an upper side of an insulation layer, and a second conductive circuit pattern configuring a circuit is formed on a lower side of the insulation layer. A through hole vertically passing through the insulation layer is formed, and a conductive material is formed on an inner circumferential surface of the through (Continued)

hole such that the first circuit pattern and the second circuit pattern are electrically connected by the through hole.

16 Claims, 9 Drawing Sheets

(52) U.S. Cl.
CPC ............... *H05K 2201/0154* (2013.01); *H05K 2203/1383* (2013.01); *Y10T 29/49155* (2015.01)

(56) References Cited

U.S. PATENT DOCUMENTS

| | | | |
|---|---|---|---|
| 6,440,542 B1* | 8/2002 | Kariya | H05K 3/0035 174/259 |
| 7,839,650 B2 | 11/2010 | Hsu | |
| 2004/0056345 A1* | 3/2004 | Gilleo | H01L 21/486 257/698 |
| 2010/0078208 A1* | 4/2010 | Inoue | H05K 3/246 174/261 |

FOREIGN PATENT DOCUMENTS

| | | |
|---|---|---|
| JP | 07-249863 | 9/1995 |
| JP | 07-302962 | 11/1995 |
| JP | 2005-123320 | 5/2005 |
| JP | 2007-266323 | 10/2007 |
| JP | 2008-149311 | 7/2008 |
| JP | 2011165127 | 8/2011 |
| KR | 10-1987-0001193 | 6/1987 |
| KR | 10-2010-0005816 | 1/2010 |
| KR | 10-2010-0029431 | 3/2010 |
| TW | I304719 | 12/2008 |

* cited by examiner

__MANUFACTURING METHOD OF DOUBLE SIDED PRINTED CIRCUIT BOARD__

TECHNICAL FIELD

The present invention relates to a manufacturing method of a double-sided printed circuit board, and more particularly, to a manufacturing method of a double-sided printed circuit board, capable of easily forming circuit patterns on upper and lower sides of an insulation layer, and easily providing electrical connection between the circuit patterns formed on the upper and lower sides of the insulation layer.

BACKGROUND ART

FIG. 1 schematically illustrates a procedure of forming circuit patterns on upper and lower sides of an insulation layer and electrically connecting the circuit patterns in a related art printed circuit board (PCB).

Referring to FIG. 1, a raw material (flexible copper clad laminate, FCCL) in which conductive layers are disposed on both sides of an insulation layer is prepared first in the related art PCB. It is illustrated that a polyimide film is used as the insulation layer, and a copper film is used as the conductive layer.

Subsequently, blanket etching is performed. Since a copper foil of the FCCL has a fixed thickness and a thickness of the FCCL is increased to or more when a through hole is plated, the FCCL becomes too thick in the case of intending to form micro-patterns, thus making it difficult to implement a precision circuit through etching. For this reason, before processing of through holes, blanket etching is performed to reduce the thickness of the FCCL.

Thereafter, the conductive layer and the insulation layer are processed to form through holes passing therethrough. Then, a pre-coating process is performed by exposing the conductive layer and the insulation layer, where the through holes are formed, to a conductive aqueous solution and thus forming a conductive film (shadow process).

Afterwards, a pre-copper electroplating process is performed by forming an electroless copper plating layer on the conductive layer and the insulation layer where the conductive film is formed, and an inner wall of the through hole is coated with a conductive copper thin film using palladium (Pd) catalytic reaction. The inner wall of the through hole is fully coated with conductive copper through electrolysis of copper.

Next, a photoresist layer is laminated, and then exposure, development, etching and delamination are performed to form a circuit with desired patterns, thereby completing a final circuit.

In this way, according to the related art PCB, a process of electrically connecting the circuit patterns formed on both sides of the insulation layer through the through holes is too complicated, leading to a decrease in productivity and an increase in failure rate.

DISCLOSURE

Technical Problem

An object of the present invention is to provide a manufacturing method of a double-sided printed circuit board, capable of easily forming circuit patterns on upper and lower sides of an insulation layer, and easily providing electrical connection between the circuit patterns formed on the upper and lower sides of the insulation layer.

Technical Solution

In one general aspect, a manufacturing method of a double-sided printed circuit board includes: forming a first conductive circuit pattern configuring a circuit on an upper side of an insulation layer; forming a second conductive circuit pattern configuring a circuit on a lower side of the insulation layer; forming a through hole vertically passing through the insulation layer; forming a conductive material on an inner circumferential surface of the through hole such that the first circuit pattern and the second circuit pattern are electrically connected by the through hole.

The through hole may be formed after a non-conductive protective film is laminated on the second circuit pattern, and the protective film may be delaminated after the conductive material is formed on the inner circumferential surface of the through hole.

When the first circuit pattern is formed, the insulation layer may be exposed to the outside in a region where the through hole is formed, and, when the second circuit pattern is formed, the insulation layer may be exposed to the outside in a region where the through hole is formed.

The first and second circuit patterns may be patterned and printed, and the conductive material may be printed on the inner circumferential surface of the through hole.

A plating layer may be formed on the conductive material formed on the first and second circuit patterns and the inner circumferential surface of the through hole.

Heat treatment may be performed after the conductive material is formed on the inner circumferential surface of the through hole.

The through hole may be formed after first and second non-conductive protective films are laminated on the first and second circuit patterns, and the first and second protective films may be delaminated after the conductive material is formed on the inner circumferential surface of the through hole.

Heat treatment may be performed after the conductive material is formed on the inner circumferential surface of the through hole.

The non-conductive protective film may be laminated on the second circuit pattern after the through hole is formed, and the protective film may be delaminated after the conductive material is formed on the inner circumferential surface of the through hole.

The through hole may be formed after a non-conductive first protective film is laminated on the second circuit pattern, and, after the second protective film is laminated on the first circuit pattern, the conductive material may be formed on the inner circumferential surface of the through hole and the first and second protective film may be delaminated.

Advantageous Effects

A manufacturing method of a double-sided printed circuit board according to the present invention, in which circuit patterns and conductive lines inside through holes are formed, provides effects of easily forming the circuit patterns on upper and lower sides of an insulation layer and easily achieving electrical connection between the circuit patterns formed on the upper and lower sides of the insulation layer.

Also, a manufacturing time is shortened by a simplified process thereby increasing productivity and reducing a failure rate, and the quality of a product is thus enhanced.

In addition, a double-sided printed circuit board can be readily manufactured through a simplified process without complicated processes such as exposure, development and etching, and environmental pollutants resulted therefrom.

Furthermore, thicknesses of the circuit patterns and a thickness of a conductive line electrically connecting the circuit patterns are easily adjusted through a printing method, and it is therefore possible to provide a double-sided printed circuit board which can be manufactured thinly.

DESCRIPTION OF DRAWINGS

The above and other objects, features and advantages of the present invention will become apparent from the following description of preferred embodiments given in conjunction with the accompanying drawings, in which.

DETAILED DESCRIPTION OF MAIN ELEMENTS

10: INSULATION LAYER
20: FIRST CIRCUIT PATTERN
30: SECOND CIRCUIT PATTERN
40: THROUGH HOLE
50: CONDUCTIVE MATERIAL
60: PROTECTIVE FILM
61: FIRST PROTECTIVE FILM
62: SECOND PROTECTIVE FILM
70: CONDUCTIVE PLATING LAYER

BEST MODE

Hereinafter, the present invention will now be specifically described in detail with reference to the accompanying drawings; however, the scope of the present invention is not limited to such a description.

Figure 1:
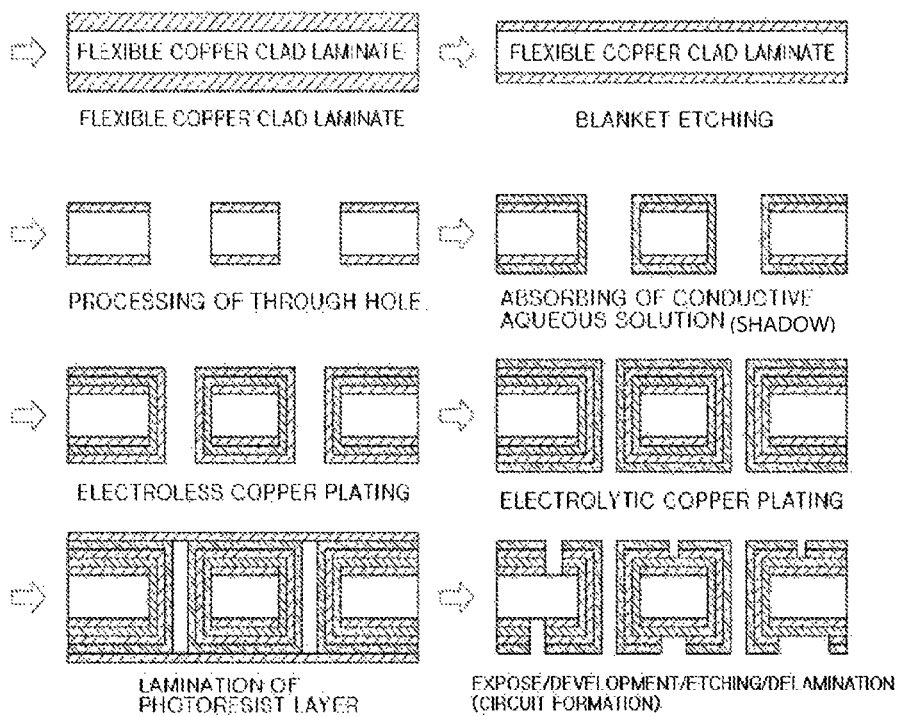
FIG. 1 schematically illustrates a method of forming circuit patterns in a related art printed circuit board and a procedure of forming through holes electrically connecting the circuit patterns.
Figure 2:
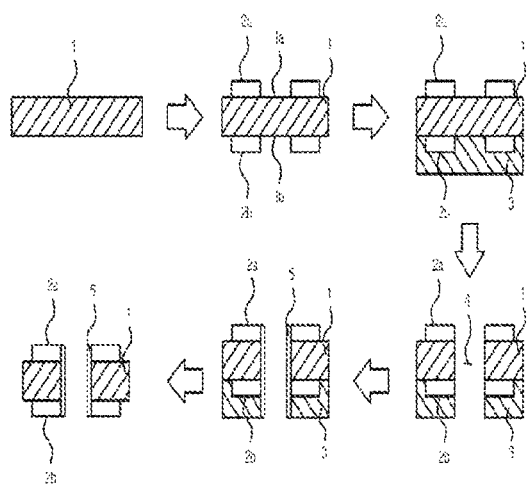
FIG. 2 is a flowchart illustrating a method of manufacturing a double-sided printed circuit board according to an embodiment of the present invention.

As illustrated in FIG. 2, a manufacturing method of a double-sided printed circuit board (PCB) according to the present invention includes: a) a step of preparing a polyimide film 1; b) a step of forming first and second circuit patterns 2a and 2b by printing silver (Ag) conductive paste of a conductive ink onto both sides, i.e., an upper side 1a and a lower side 1b, of the polyimide film 1, respectively; c) a step of laminating a polyethylene terephthalate (PET) film 3, which serves as a protective film, on the second circuit pattern 2b printed onto the lower side 1b of the polyimide film 1; d) a step of forming a through hole 4 vertically passing through a substrate 1 and the PET film 3; e) a step of forming a conductive line 5 connecting the first and second circuit patterns 2a and 2b through the through hole 4 by printing the Ag conductive paste of a conductive ink on an inner wall of the through hole 4, such that the first circuit pattern 2a formed on the upper side 1a of the substrate 1 and the second circuit pattern 2b formed on the lower side 1b are electrically connected to each other through the through hole 4; and f) a step of removing the PET film 3.

In the step a), the substrate 1 may include a PI film, a PET film, or a PEN film, but is not limited thereto.

In the step b), the circuit patterns 2a and 2b may be formed by printing a conductive paste which is a conductive ink. Here, printing may be performed using gravure printing, inkjet printing, offset printing, silk-screen printing, rotary screen printing, flexo printing, or imprinting process.

After the printing of the circuit patterns 2a and 2b, a post treatment selected from among oxidation treatment, reduction treatment, heat treatment, infrared treatment, ultraviolet (UV) treatment, irradiation treatment, or laser treatment may be performed, and the heat treatment may be performed at a temperature ranging from 80° C. to 400° C.

In the step b), the conductive paste forming the circuit patterns 2a and 2b may include an organic silver complex.

The organic silver complex may be obtained by allowing at least one silver compound expressed by Formula 1 below to react with at least one of ammonium carbamate-based compounds or ammonium carbonate-based compounds expressed by Formula 2, Formula 3 or Formula 4 below.

$$Ag_nX \quad \text{(Formula 1)}$$

(where n is an integer of 1 to 4; and X is a substituent selected from oxygen, sulfur, halogen, cyano, cyanate, carbonate, nitrate, nitrite, sulfate, phosphate, thiocyanate, chlorate, perchlorate, tetrafluoroborate, acetylacetonate, carboxylate, and derivatives thereof)

(Formula 2)

(Formula 3)

(Formula 4)

(where, R1, R2, R3, R4, R5 and R6 may be identical to or different from one another, and are respectively a substituent selected from hydrogen, C1-C30 aliphatic or alicyclic alkyl group or aryl group or aralkyl group, an alkyl group and aryl group with a functional group substituted, a heterocyclic compound group, a polymer compound group, and derivatives thereof).

The conductive paste may further include a conductor, a metal precursor or a mixture of at least one species thereof.

The conductor may include at least one component selected from the group consisting of Ag, Au, Cu, Ni, Co, Pd, Pt, Ti, V, Mn, Fe, Cr, Zr, Nb, Mo, W, Ru, Cd, Ta, Re, Os, Ir, Al, Ga, Ge, In, Sn, Sb, Pb, Bi, Sm, Eu, Ac, Th and at least one metal or alloys thereof or alloy oxides thereof, conductive carbon black, graphite, carbon nanotubes and conductive polymers.

The metal precursor may be selected from one more metal compound groups of Formula 5 below.

MnX    (Formula 5)

(where, M is a metal group of the conductor; n is an integer of 10 or less; and X is a substituent selected from oxygen, sulfur, halogen, cyano, cyanate, carbonate, nitrate, nitrite, sulfate, phosphate, thiocyanate, chlorate, perchlorate, tetrafluoroborate, acetylacetonate, mercapto, amide, alkoxide, carboxylate, and derivatives thereof)

The metal precursor may include at least one component selected from the group consisting of gold acetate, palladium oxalate, silver 2-ethylhexnoate, copper 2-ethylhexanoate, iron stearate, nickel formate, zinc citrate, bismuth acetate, silver nitrate, copper cyanide, cobalt carbonate, platinum chloride, chloroaurate, tetrabutoxy titanium, dimethoxyzirconium dichloride, aluminum isopropoxide, tin tetrafluoroborate, vanadium oxide, indium-tin oxide, ruthenium oxide, tantalum methoxide, dodecyl mercapto gold, and indium acetylacetonate.

The used amount of the conductor, metal precursor or mixture thereof may be in the range of 1-90% by weight based on a paste composition.

The conductor or metal precursor may have a state selected from the group consisting of particle, powder, flake, colloid, hybrid, paste, sol, solution and mixed states thereof.

The conductor and the metal precursor may have at least one shape selected from the group consisting of a spherical shape, a linear shape, a flat shape, or mixed shapes thereof.

The conductive paste and the printing method may be identically or differently applied in the step b) and the step e).

Here, in the case where the PET film 3 is laminated in the step c), spreading may be prevented when the through hole 4 is formed for electrically connecting the necessary circuit patterns 2a and 2b on the both sides of the substrate 1 in the step d).

The protective film of the step c) may use a PET film, a PEN film, a fabric mesh, a metal mesh, a paper or a rubber film. The protective film may be laminated by thermally compressing two sheets of protective films, and may be formed by, for example, compressing the PET film onto an object using a film laminator.

The step d) is a process of processing a hole to have a diameter designed to be suitable for electrical connection between the first circuit pattern 2a formed on the upper side 1a of the substrate 1 and the second circuit pattern 2b formed on the lower side 1b.

The through hole 4 in the step d) may be formed using a CNC drill bit or a laser source.

Here, the diameter of the through hole 4 may be at least in the range of 0.08 mm to 1 mm or may be 1 mm or more. For example, the through hole 4 may be formed to have a diameter of 0.2 mm to 0.3 mm.

In the step e), the conductive line 5 is formed by printing a Ag conductive paste on an inner wall of the through hole 4 such as a bridge which electrically and physically connects the first circuit pattern 2a formed on the upper side 1a of the substrate 1 to the second circuit pattern 2b formed on the lower side 1b.

A method for manufacturing the double-sided printed circuit board according to the present invention will now be described in more detail as an example, but such a description is not intended to limit the scope of the present invention. The Ag conductive paste is printed on the upper side 1a of the polyimide film 1 using a silk-screen printing to have a thickness of about 3-7 μm, a minimum linewidth of 75 μm, and a line spacing of 75 μm, and then subjected to high-temperature heat treatment at about 150-200° C. to form a single tone pattern 2a. The lower side 1b, which is opposite to the single tone printed side, is printed with the same thickness and pattern spacing while keeping a position accuracy of about ±10 μm, and thereafter a double tone pattern 2b as a circuit pattern is formed under the same temperature condition as in the single tone pattern. A polymer adhesive is pressed to a thickness of 12 μm on the side, where the single or double tone pattern 2a or 2b is printed, at a rate of 5 M/min under a room temperature condition by using a protective film 3 composed of a PET film with a thickness of 75 μm. In a side opposite to the side where the protective film 3 is pressed, the through hole 4 is formed at a rate of about 80,000 to 150,000 rpm using a 0.2-0.3 μm CNC drill bit. The Ag conductive paste of which a viscosity is lower than that of the Ag conductive paste used in the single and double tone patterns 2a and 2b is printed to a thickness of about 1-3 μm on the inner wall of the through hole 4 in the side opposite to the side with the protective film 3 pressed, thereby forming the conductive line 5. Thereafter, heat treatment is performed at about 80° C. to 200° C. and then the protective film 3 is removed to manufacture a double-sided printed circuit board. The scope of the present invention is not limited to the numerical range and condition as described herein.

Figure 3:
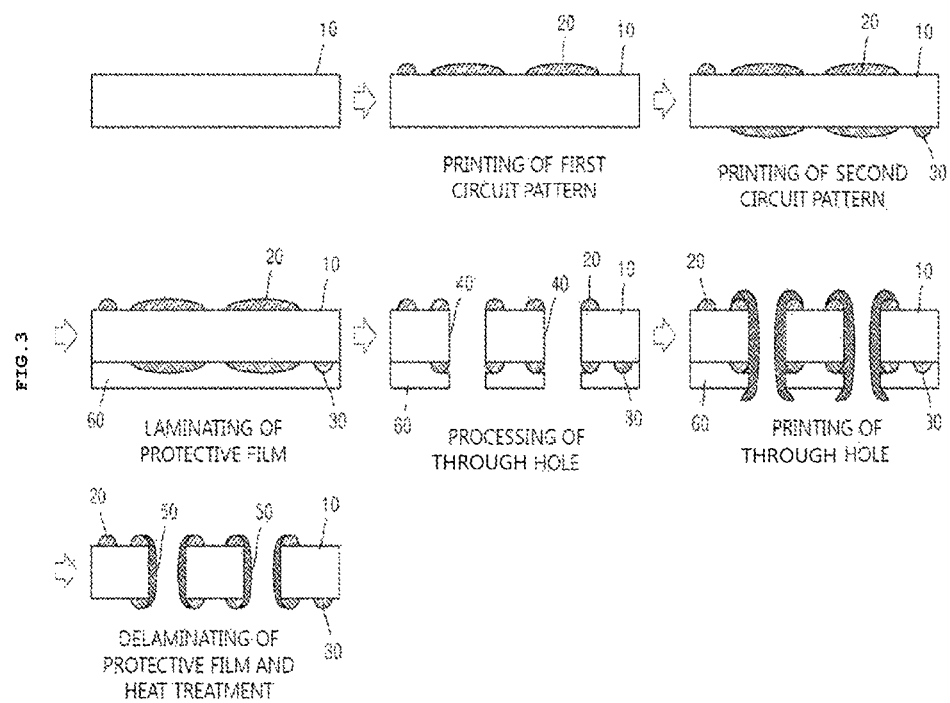
FIG. 3 is a flowchart illustrating a method of manufacturing a double-sided printed circuit board according to another embodiment of the present invention.

FIG. 3 is a flowchart illustrating a method of manufacturing a double-sided printed circuit board according to another embodiment of the present invention.

The method for manufacturing the double-sided printed circuit board with reference to FIG. 3 includes forming first and second circuit patterns 20 and 30, forming a through hole 40, and forming a conductive material 50 on an inner circumferential surface of the through hole 40.

The method of manufacturing the printed circuit board according to the present invention begins with forming desired patterns first.

The first circuit pattern 20 is a patterned circuit using a conductive material in order to form a circuit on an upper side of an insulation layer 10. In the current embodiment, the first circuit pattern 20 is printed using a known paste such as silver (Ag), copper (Cu), nickel (Ni), and aluminum (Al). Of course, the method of forming the first circuit pattern 20 is not limited to the printing method. The insulation layer 10 uses a known film such as a polyimide film.

The second circuit pattern 30 is a patterned circuit using a conductive material in order to form a circuit on a lower side of the insulation layer 10. In the current embodiment, like the first circuit pattern 20, the second circuit pattern 30 is printed using a known paste such as silver (Ag), copper (Cu), nickel (Ni), and aluminum (Al). Of course, the method of forming the second circuit pattern 30 is also not limited to the printing method.

Thereafter, forming of the through hole 40 is performed. The through hole 40 passes through the insulation layer 10 vertically. In the current embodiment, referring to FIG. 3, when the first circuit pattern 20 is formed, the insulation layer 10 is exposed to the outside in a region where the through hole 40 is formed. Also, when the second circuit pattern 30 is formed, the insulation layer 10 is exposed to the outside in a region where the through hole 40 is formed.

Thus, the first circuit pattern 20 provided in an upper portion of a region where the through hole 40 is formed, and the circuit pattern 30 provided in a lower portion thereof are patterned in consideration of the through hole 40 to be formed later. Accordingly, through hole 40 is formed by processing the insulation layer 10 to have a hole substantially passing therethrough.

Thereafter, forming of the conductive material 50 on the inner circumferential surface of the through hole 40 is performed.

In the current embodiment, the inner circumferential surface of the through hole 40 is printed using a known paste such as silver (Ag), copper (Cu), nickel (Ni), and aluminum (Al). Through the procedure as described above, a printed circuit board is formed in which the first and second circuit patterns 20 and 30 are electrically connected by the through hole 40.

In accordance with the method of forming a double-sided printed circuit board according to the present invention, the first and second circuit patterns 20 and 30 are formed first, then the through hole 40 is formed, and thereafter the conductive material 50 is formed on the through hole 40 so as to electrically connect the first and second circuit patterns 20 and 30. Therefore, the inventive method makes it possible to realize a printed circuit board with a simple process compared to a related art printed circuit board which could be obtained through a complicated process so as to form circuit patterns electrically connected by the through hole.

According to the embodiment of the present invention, a protective film 60 may be laminated before the conductive material 50 is formed on the inner circumferential surface of the through hole 40.

Referring to FIG. 3, after the first and second circuit patterns 20 and 30 are formed, the non-conductive protective film 60 is laminated on the second circuit pattern 30. In the current embodiment, a polyethylene terephthalate (PET) film is used as the protective film 60. The protective film 60 is provided for the purpose of preventing the conductive material 50 from penetrating into the second circuit pattern 30 when the conductive material 50 is printed on the inner circumferential surface of the through hole 40 during a subsequent process.

That is, when the conductive material 50 is printed on the inner circumferential surface of the through hole without use of the protective film 60, the conductive material 50 may penetrate into the second circuit pattern 30 to cause the printed circuit board to be failed if an excessive amount of the conductive material 50 is used. The protective film 60 prevents the conductive material 50 from spreading over into the second circuit pattern 30.

As described above, after the protective film 60 is laminated, forming of the through hole 40 and printing of the conductive material 50 on the through hole 40 are performed as illustrated in FIG. 3, and then a delamination process of removing the protective film 60 is performed.

Through the procedure as above, the first and second circuit patterns 20 and 30 are finally formed on the upper and lower sides of the insulation layer 10, and the first and second circuit patterns 20 and 30 are electrically connected by means of the conductive material 50 formed on the inner circumferential surface of the through hole 40.

Also, according to the current embodiment, heat treatment is performed after the conductive material 50 is printed on the through hole 40. While the heat treatment is performed after the conductive material 50 is printed on the through hole 40, the conductive material is cured and shrunk.

Figure 4:
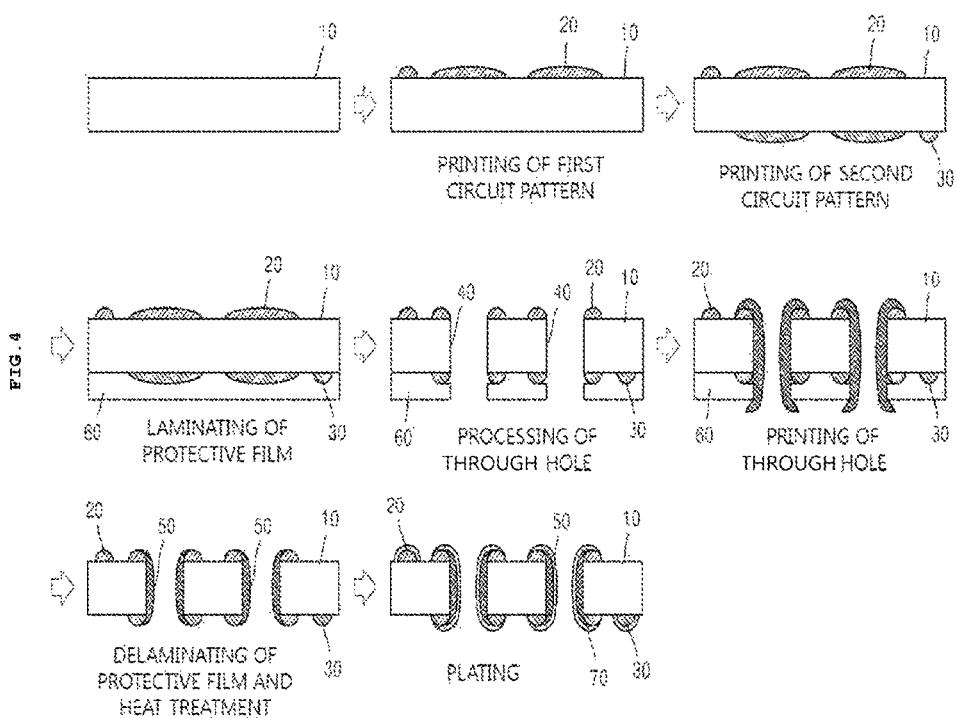
FIGS. 4 to 10 are flowcharts illustrating a method of manufacturing a double-sided printed circuit board according to another embodiment of the present invention.

Referring to FIG. 4, a conductive plating layer 70 may be formed on the first and second circuit patterns 20 and and the conductive material 50 formed on the inner circumferential surface of the through hole 40.

In the current embodiment, the plating layer 70 may be a copper layer formed by electroless or electrolytic copper plating. The plating layer 70 may be plated such that its thickness is adjusted in consideration of an amount of current applied and consumed.

Since electrical conductivity increases due to the plating layer 70, it is possible to form the first and second circuit patterns 20 and 30 to a thickness only enough to keep properties of a seed layer. If the amount of current applied and consumed is large, it is desirable to form the plating layer 70 with an appropriate thickness.

In this way, the method of forming the double-sided printed circuit board according to the embodiment of the present invention enables the first and second circuit patterns 20 and 30 of the printed circuit board to be electrically connected through a simplified process, by rapidly forming the first and second circuit patterns 20 and 30, forming the through hole 40 connecting the first and second circuit patterns 20 and 30, and then printing the conductive material 50 on the inner circumferential surface of the through hole 40 for electrical connection between the first and second circuit patterns 20 and 30.

Therefore, a processing time is shortened to improve productivity. In addition, a failure rate, which is relatively high in a related art complicated process, may be significantly reduced by virtue of a simplified process, and the quality of products is thus enhanced.

FIGS. 5 to 9 illustrate a method of forming a precision printed circuit board according to another embodiment of the present invention, in which circuit patterns and a conductive line inside a through hole are formed.

Figure 5:
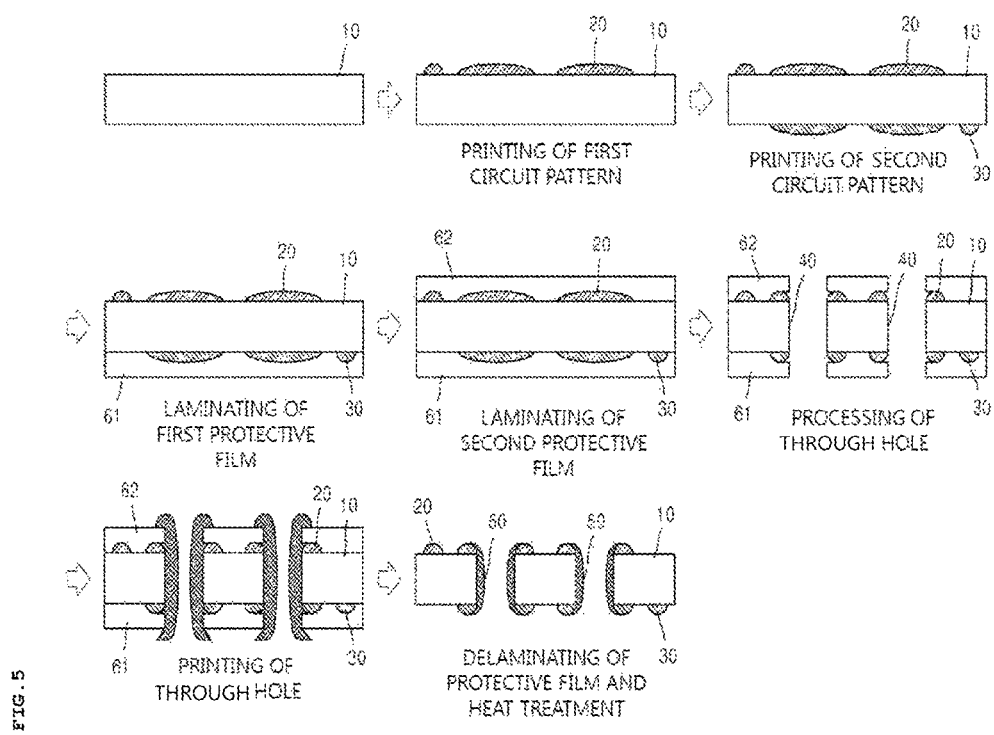

Referring to FIG. 5, first and second circuit patterns 20 and 30 are respectively formed on upper and lower sides of an insulation layer 10, then first and second protective films 61 and 62 are laminated on the first and second circuit patterns 20 and 30, and thereafter a through hole 40 is processed.

Thereafter, printing of the conductive material 50 on the through hole 40 is performed, and the first and second protective films 61 and 62 are then delaminated. In the current embodiment, heat treatment is performed after the conductive material 50 is printed on the through hole 40, and the conductive material 50 printed on inner surface of the through hole 40 is cured and shrunk during the heat treatment.

Figure 6:
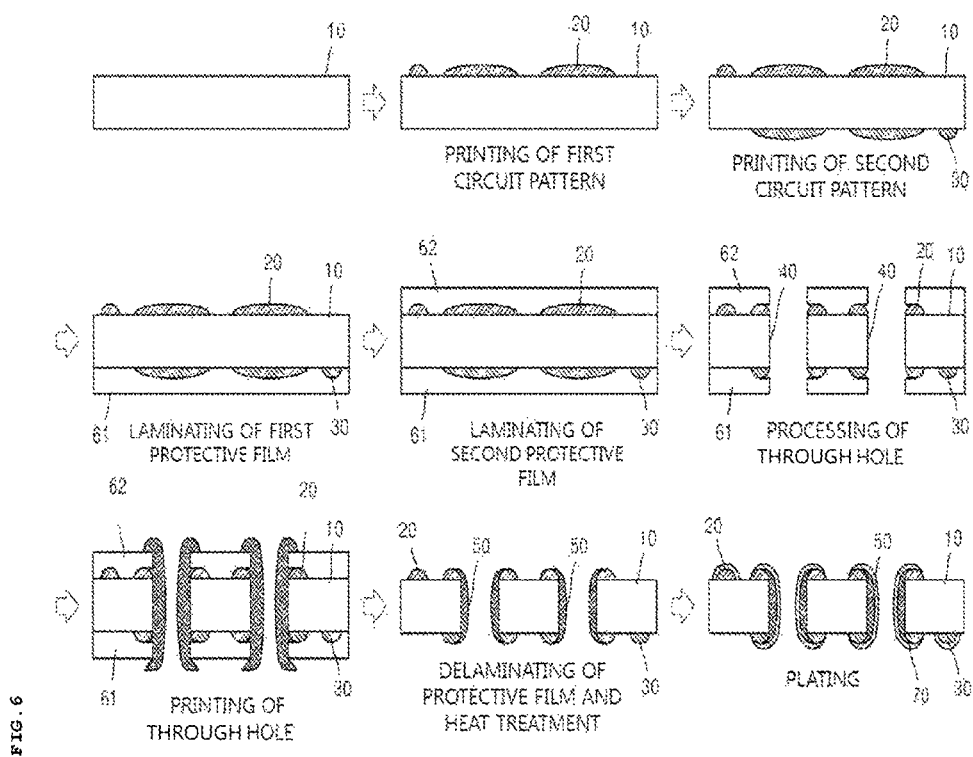

FIG. 6 illustrates, in addition to the embodiment of FIG. 5, that the conductive plating layer 70 may be further provided on the conductive material 50 formed in the first and second circuit patterns 20 and 30 and the through hole 40. The function and effect of the plating layer 70 have been described above, and thus further detailed description will be skipped herein.

Figure 7:
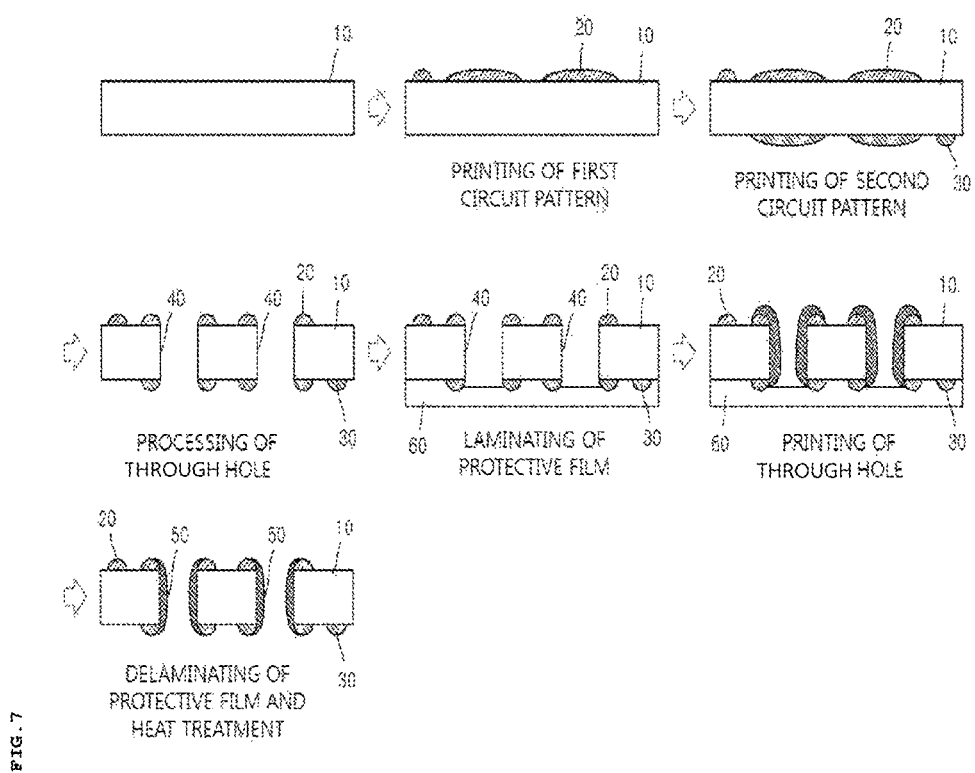

Referring to FIG. 7, first and second circuit patterns 20 and 30 are respectively formed on upper and lower sides of an insulation layer 10, and the through hole 40 is then formed. Afterwards, a non-conductive protective film 60 is laminated on the second circuit pattern 30, then a conductive material 50 is printed on an inner surface of the through hole 40, and thereafter the protective film 60 is delaminated.

In the current embodiment, heat treatment is performed after the conductive material 50 is printed on the inner surface of the through hole 40, and the conductive material 50 is cured and shrunk during the heat treatment.

Figure 8:
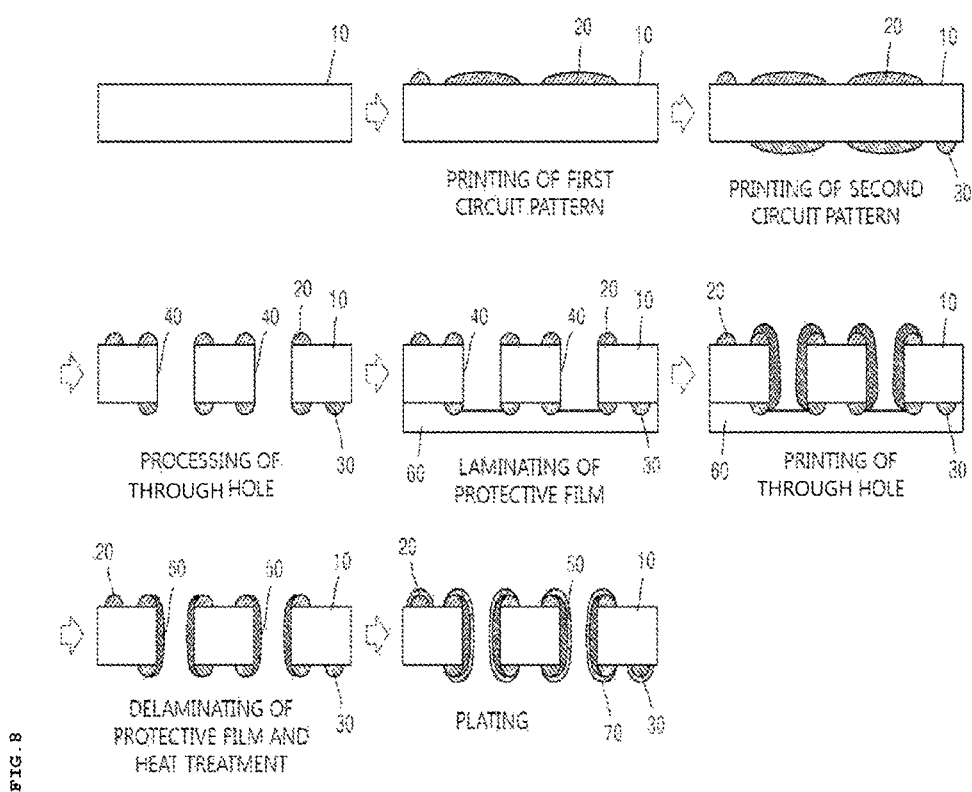

FIG. 8 illustrates, in addition to the embodiment of FIG. 6, that the conductive plating layer 70 may be further formed on the conductive material 50 formed in the first and second circuit patterns 20 and 30 and the through hole 40. The function and effect of the plating layer 70 have been described above, and thus further detailed description will be skipped herein.

Figure 9:
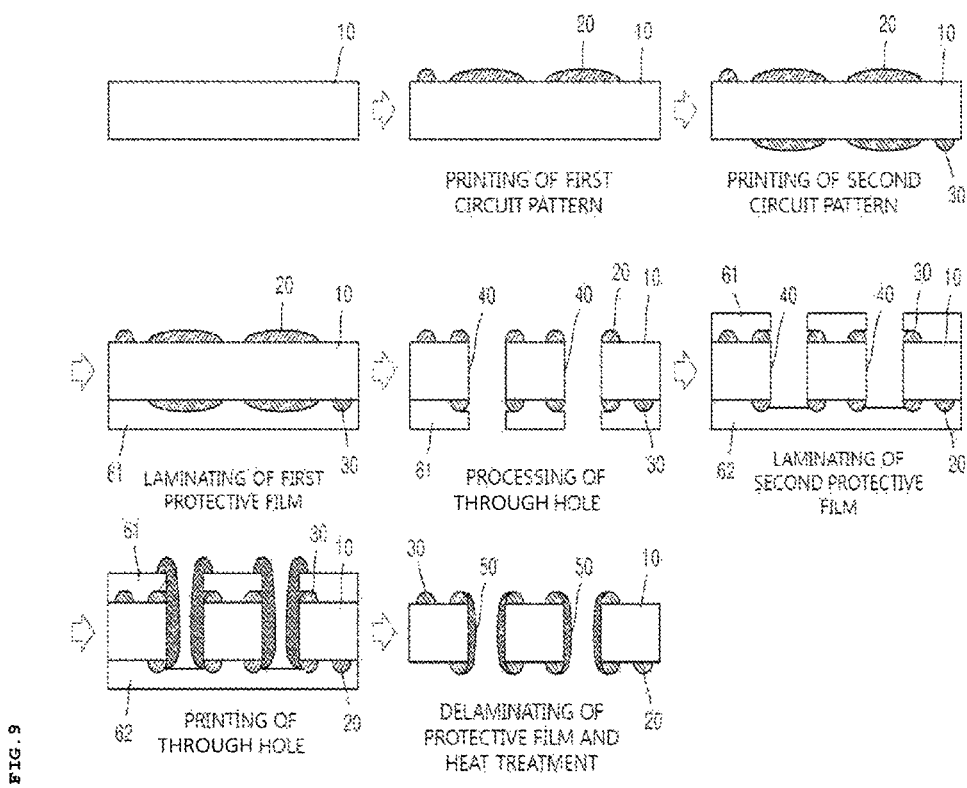

Referring to FIG. 9, the first and second circuit patterns 20 and 30 are formed on upper and lower sides of the insulation layer 10, the first non-conductive protective film 61 is laminated on the second circuit pattern 30. Then, the through hole 40 is formed, and the insulation layer 10 where the through hole 40 is formed is turned over and a second protective film 62 is laminated on the first circuit pattern 20.

Subsequently, a printing process of filling the conductive material 50 into the through hole 40 is performed, and thereafter, the first and second protective films 61 and 62 are delaminated. In the current embodiment, heat treatment is performed after the conductive material 50 is printed on inner surface of the through hole 40, and the conductive material 50 is cured and shrunk during the heat treatment.

Figure 10:
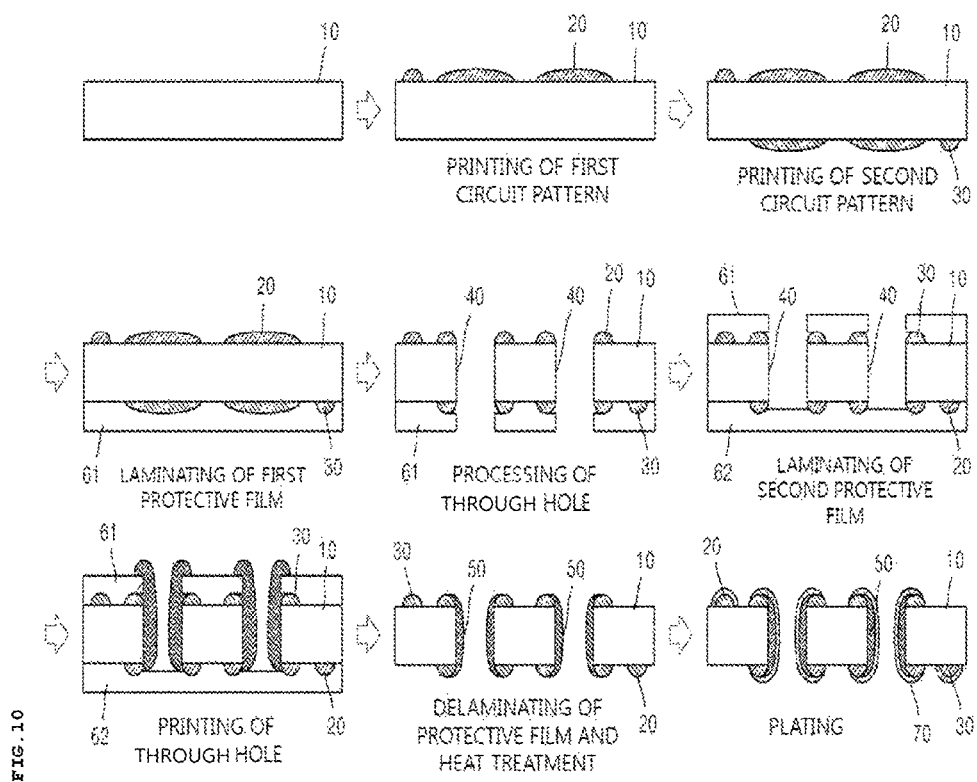

FIG. 10 illustrates, in addition to the embodiment of FIG. 8, that a conductive plating layer 70 may be further provided on the conductive material 50 formed in the first and second circuit patterns 20 and 30 and the through hole 40. The function and effect of the plating layer 70 have been described above, and thus further detailed description will be skipped herein.

A method of forming a precision printed circuit board according to FIGS. 5 to 10 are similar in function and effect to the method in the embodiment of FIG. 4, and thus further detailed description will be skipped herein.

While the present invention has been shown and described in connection with the exemplary embodiments, it will be apparent to those skilled in the art that modifications and variations can be made without departing from the spirit and scope of the invention as defined by the appended claims.

The invention claimed is:

1. A method of manufacturing a double-sided printed circuit board, comprising:
    forming a first conductive circuit pattern by printing a first conductive paste on an upper side of an insulation layer;
    forming a second conductive circuit pattern by printing a second conductive paste on a lower side of the insulation layer;
    forming a through hole vertically passing through the insulation layer after the steps of forming the first conductive circuit pattern and the second conductive circuit pattern;
    laminating a lower non-conductive protective film over the second conductive circuit pattern and exposed regions of the lower side of the insulation layer after the through hole is formed, thereby blocking a first opening of the through hole and forming a temporary blind hole having an unblocked second opening;
    forming a conductive material by printing a third conductive paste through the second opening and onto an inner circumferential surface of the blind hole and portions of the first circuit pattern and second circuit pattern adjacent the blind hole; and
    delaminating the lower non-conductive protective film to reopen the through hole, wherein a residual portion of the conductive material on the inner circumferential surface of the through hole provides an electrical connection between the first circuit pattern and the second circuit pattern,
    wherein a diameter of the through hole ranges from 0.08 mm to 1 mm and the conductive material has a thickness ranging from 1 μm to 3 μm,
    wherein a viscosity of the third conductive paste is lower than both a viscosity of the first conductive paste and a viscosity of the second conductive paste, and
    wherein the steps of forming the first conductive circuit pattern, the second conductive circuit pattern and the conductive material is performed using one selected from the group of consisting of gravure printing, inkjet printing, offset printing, silk-screen printing, rotary printing, flexo printing, and imprinting process.

2. The method of claim 1, wherein,
    when forming the first circuit pattern, a portion of the upper side of the insulation layer is exposed in a region where the through hole is to be formed, and,
    when forming the second circuit pattern, a portion of the lower side of the insulation layer is exposed in a region where the through hole is to be formed.

3. The method of claim 1, further comprising:
    forming a plating layer on the residual conductive material and on the first and second circuit patterns.

4. The method of claim 1, further comprising:
    heat treating the residual conductive material.

5. The method of claim 1, further comprising:
    laminating an upper non-conductive protective film over the first conductive circuit pattern and exposed regions of the upper side of the insulation layer; and
    forming the through hole through the insulation layer and the upper non-conductive protective film; and
    delaminating the upper non-conductive protective film.

6. The method of claim 5, further comprising:
    forming a plating layer on the residual conductive material and the first and second circuit patterns.

7. The method of claim 5, further comprising:
    heat treating the residual portion of the conductive material.

8. The method of claim 5, wherein at least one of the upper or lower non-conductive protective films is a premanufactured solid film.

9. The method of claim 5, wherein at least one of the upper or lower non-conductive protective films is applied over the insulation layer as a liquid.

10. The method of claim 5, wherein the step of forming a conductive material further comprises printing the third conductive paste over predetermined regions of the insulating layer adjacent the unobstructed second opening of the through hole and into the temporary blind hole.

11. The method of claim 5, further comprising:
    forming a conductive plating layer on the residual conductive material, the first circuit pattern, and the second circuit pattern.

12. The method of claim 1, further comprising heat treating the residual conductive material.

13. The method of claim 1, wherein the lower non-conductive protective film is a premanufactured solid film.

14. The method of claim 1, wherein the lower non-conductive protective film applied as a liquid over the second conductive circuit pattern.

15. A method of manufacturing a double-sided printed circuit board, comprising:
    forming a first conductive circuit pattern by printing a first conductive paste on a first side of an insulation layer;
    forming a second conductive circuit pattern by printing a second conductive paste on a second side of the insulation layer, the first side being opposite the second side;

forming a through hole vertically passing through the insulation layer after the steps of forming the first conductive circuit pattern and the second conductive circuit pattern;

laminating a blocking film over a first opening of the through hole to form a temporary blind hole;

forming a conductive material by printing a third conductive paste through an unobstructed second opening of the through hole onto an inner circumferential surface of the blind hole and portions of the first circuit pattern and second circuit pattern adjacent the blind hole; wherein a viscosity of the third conductive paste is lower than both a viscosity of the first conductive paste and a viscosity of the second conductive paste, and delaminating the blocking film to reopen the through hole, wherein a residual portion of the conductive material on the inner circumferential surface of the through hole provides an electrical connection between the first circuit pattern and the second circuit pattern, wherein a diameter of the through hole is within a range of 0.08 mm to 1 mm and the conductive material has a thickness within a range of 1 μm to 3 μm, and the steps of forming the first conductive circuit pattern, the second conductive circuit pattern and the conductive material is performed using one selected from the group of consisting of gravure printing, inkjet printing, offset printing, silk-screen printing, rotary printing, flexo printing, and imprinting process.

16. The method of claim 15, further comprising:

laminating a protective film over one of the first or second conductive circuit patterns;

forming the through hole through the insulation layer and the protective film; and laminating the blocking film over the insulation layer opposite the protective film.

\* \* \* \* \*